United States Patent
Koshihara

(10) Patent No.: US 10,810,924 B2
(45) Date of Patent: Oct. 20, 2020

(54) ELECTRO-OPTICAL DEVICE AND ELECTRONIC APPARATUS

(71) Applicant: SEIKO EPSON CORPORATION, Tokyo (JP)

(72) Inventor: Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 113 days.

(21) Appl. No.: 16/014,483

(22) Filed: Jun. 21, 2018

(65) Prior Publication Data

US 2019/0005863 A1 Jan. 3, 2019

(30) Foreign Application Priority Data

Jun. 30, 2017 (JP) ................................ 2017-128228

(51) Int. Cl.
| | |
|---|---|
| *G09G 3/20* | (2006.01) |
| *G02B 5/20* | (2006.01) |
| *H01L 27/32* | (2006.01) |
| *G09G 3/22* | (2006.01) |
| *G09G 3/3208* | (2016.01) |

(52) U.S. Cl.
CPC ............ *G09G 3/2003* (2013.01); *G02B 5/20* (2013.01); *G02B 5/201* (2013.01); *G09G 3/22* (2013.01); *G09G 3/3208* (2013.01); *H01L 27/322* (2013.01); *H01L 27/3211* (2013.01); *G09G 2300/0452* (2013.01); *G09G 2310/0264* (2013.01); *G09G 2320/043* (2013.01); *H01L 27/3216* (2013.01)

(58) Field of Classification Search
CPC .. G02B 5/20; G02B 5/201; G09G 2300/0452; G09G 2310/0264; G09G 2320/043; G09G 3/2003; G09G 3/22; G09G 3/3208; H01L 27/3211; H01L 27/3216; H01L 27/322
See application file for complete search history.

(56) References Cited

U.S. PATENT DOCUMENTS

| | | | |
|---|---|---|---|
| 10,168,533 B2 | 1/2019 | Koshihara | |
| 2008/0224968 A1* | 9/2008 | Kashiwabara | ...... H01L 27/3213 345/83 |
| 2009/0116094 A1* | 5/2009 | Sugiyama | ............... H04N 13/31 359/245 |
| 2010/0014012 A1* | 1/2010 | Irie | .................... G02F 1/133707 349/39 |
| 2010/0188322 A1* | 7/2010 | Furukawa | ......... G02F 1/133514 345/83 |
| 2012/0075278 A1* | 3/2012 | Hara | .................... H01L 27/3218 345/211 |

(Continued)

FOREIGN PATENT DOCUMENTS

| | | |
|---|---|---|
| JP | H11-183891 A | 7/1999 |
| JP | 2008-225179 A | 9/2008 |

(Continued)

*Primary Examiner* — Amy Onyekaba
(74) *Attorney, Agent, or Firm* — Oliff PLC

(57) ABSTRACT

An electro-optical device has a first pixel disposed on a substrate, a second pixel disposed on the substrate and has a different color from the first pixel, a first color filter that overlaps the first pixel in a plan view in a normal direction of the substrate; and a second color filter that overlaps the second pixel and has an opening in the plan view.

20 Claims, 10 Drawing Sheets

(56) References Cited

U.S. PATENT DOCUMENTS

| | | | |
|---|---|---|---|
| 2012/0223979 A1* | 9/2012 | Matsukura | G02B 5/201 345/690 |
| 2013/0010239 A1* | 1/2013 | Park | G02F 1/133512 349/106 |
| 2013/0162616 A1* | 6/2013 | Park | G09G 3/3648 345/211 |
| 2014/0361316 A1* | 12/2014 | Nozawa | H01L 51/56 257/88 |
| 2015/0102376 A1* | 4/2015 | Toya | H01L 27/322 257/98 |
| 2015/0236074 A1* | 8/2015 | Akagawa | G02B 5/201 257/40 |
| 2015/0331279 A1* | 11/2015 | Kimura | G02B 5/201 349/42 |
| 2015/0332647 A1* | 11/2015 | Kurasawa | G02F 1/13306 345/88 |
| 2016/0140905 A1* | 5/2016 | Yoo | G09G 3/20 345/690 |
| 2016/0155757 A1* | 6/2016 | Yamazaki | H01L 27/1218 349/43 |
| 2016/0190520 A1* | 6/2016 | Koshihara | G02B 27/0172 257/40 |
| 2016/0291369 A1* | 10/2016 | Park | G02F 1/136209 |
| 2016/0293899 A1* | 10/2016 | Hong | C23C 14/042 |
| 2016/0313601 A1* | 10/2016 | Nam | G02F 1/133512 |
| 2016/0351647 A1* | 12/2016 | Koshihara | H01L 27/3258 |
| 2017/0004780 A1* | 1/2017 | De Greef | G09G 3/348 |
| 2017/0104045 A1* | 4/2017 | Hanamura | H01L 51/56 |
| 2017/0249915 A1* | 8/2017 | Xi | G02F 1/133 |
| 2017/0345875 A1* | 11/2017 | Shim | H01L 51/5284 |
| 2017/0352707 A1* | 12/2017 | Kim | H01L 27/3209 |
| 2018/0151651 A1* | 5/2018 | Kim | H01L 27/3248 |
| 2019/0027544 A1* | 1/2019 | Nozawa | H01L 27/3265 |

FOREIGN PATENT DOCUMENTS

| | | |
|---|---|---|
| JP | 2010-170044 A | 8/2010 |
| JP | 2012-069436 A | 4/2012 |
| JP | 2015-173003 A | 10/2015 |
| JP | 2016-122614 A | 7/2016 |
| JP | 2016-218476 A | 12/2016 |

* cited by examiner

ELECTRO-OPTICAL DEVICE AND ELECTRONIC APPARATUS

BACKGROUND

1. Technical Field

The present invention relates to an electro-optical device and an electronic apparatus.

2. Related Art

An electro-optical device is known which includes a light-emitting element such as an organic electro luminescent (EL) element and has a configuration in which a color filter which transmits light with a desired wavelength range is provided on a sealing layer which covers the light-emitting element so as to realize a color display. For example, JP-A-2015-173003 discloses an electro-optical device in which a red color filter which transmits red (hereinafter, referred to as R) light, a green color filter which transmits green (hereinafter, referred to as G) light, and a blue color filter which transmits blue (hereinafter, referred to as B) light are provided on a sealing layer which covers a light-emitting element. A configuration in which a color filter is not provided at the center of each pixel of R, G, and B of the electro-optical device is disclosed.

Meanwhile, a light-emitting element is formed by laminating each member such as a reflective electrode, a pixel electrode, a light-emitting layer, a counter electrode and the like on a substrate. The pixel electrode is provided for each light-emitting element, and is separated between the light emitting elements. Furthermore, there is a case where an adjustment layer which adjusts the distance from the reflective electrode to the counter electrode is provided depending on light-emitting colors. For this reason, the members laminated on the substrate become non-uniform and uneven. When the light emitted from the light-emitting layer is incident into a portion which has a step difference or non-uniformity for each member, scattered light (hereinafter, referred to as "internal scattered light") is generated.

In the case of the above-described electro-optical device in the related art, however, there is a problem that the internal scattered light is emitted from the opening of the color filter to the outside of the electro-optical device, which causes deterioration in the quality of display images.

SUMMARY

An advantage of some aspects of the invention is to suppress the deterioration in the quality of display images even when luminance of a pixel is increased.

According to an aspect of the invention, there is provided an electro-optical device including a first pixel disposed on a substrate, a second pixel which has a different color from the first pixel disposed on the substrate, a first color filter that overlaps the first pixel in a plan view in a normal direction of the substrate, and a second color filter that overlaps the second pixel and has an opening in the plan view.

In this case, the luminance of the second pixel is enhanced by means of the opening of the second color filter while the internal scattered light is absorbed into an area of the second color filter other than the opening, which suppresses the deterioration in the quality of display images. Particularly, out of the scattered light generated from the scattering structure in the vicinity of the boundary between the first pixel and the second pixel, the scattered light toward the first color filter can be suppressed by means of the first color filter. As a result, the luminance of the second pixel can be enhanced while the quality of display images is improved.

Furthermore, in this aspect, the term "overlap" includes a case where an entire area is overlapped and a case where a part of areas is overlapped as well.

In the electro-optical device, the opening preferably overlaps a center of the second pixel in the plan view.

Generally, a light scattering structure is present largely at the end of pixels, whereas the light scattering structure is small in the vicinity of the center of the pixel. For this reason, the possibility that the internal scattered light is emitted in the vicinity of the center of the second pixel decreases, compared to that of the end of the second pixel. Accordingly, in the plan view, the opening overlaps the center of the second pixel so that a portion where the internal scattered light is unlikely to be emitted is opened. Therefore, the deterioration in the quality of display images can be suppressed while the luminance of the second pixel can be enhanced.

In the electro-optical device, each of the first pixel and the second pixel preferably includes a light-emitting element, and an area of the second color filter other than the opening preferably overlaps a part or an entirety of the structure in which light emitted from at least one light-emitting element of the first pixel and the second pixel is scattered.

In this case, since the internal scattered light is emitted easily in the structure, and the area of the second color filter other than the opening overlaps a part or an entirety of the structure in the plan view, the light which is emitted from the portion where the internal scattered light is more likely to be emitted is easily absorbed into the second color filter. Accordingly, the deterioration in the quality of display images can be suppressed.

In the electro-optical device, each of the first pixel and the second pixel preferably includes the light-emitting element, a supply circuit which supplies a current to the light-emitting element, a contact which electrically connects the supply circuit to the light-emitting element, and a reflective electrode, and the structure is preferably at least one of a portion between the reflective electrode of the first pixel and the reflective electrode of the second pixel, and the contact of the second pixel.

In this case, the internal scattered light which is generated from at least one of a potion between the reflective electrodes of the two pixels, and the contact is likely to be absorbed into the color filter. Accordingly, the deterioration in the quality of display images can be suppressed.

In the electro-optical device, a transparent member that protects the first color filter and the second color filter is preferably included, and an incident angle of light which passes through an end of the opening to reach an interface between the transparent member and the air with respect to the interface, out of light scattered from the structure, is equal to or greater than a critical angle in a cross section including the end of the opening and the structure along the normal line.

In this case, when the incident angle is equal to or greater than the critical angle, the internal scattered light is totally reflected at the interface of the transparent member so as not to be emitted to the outside of the electro-optical device. Accordingly, the deterioration in the quality of display images can be suppressed.

In the electro-optical device, a lifespan of the light-emitting element of the second pixel is preferably shorter than a lifespan of the light-emitting element of the first pixel.

Generally, since the larger the driving current is, the shorter the lifespan of the light-emitting element is, the lifespan of an electro-optical device is determined by the lifespan of a light-emitting element with the largest driving current. Accordingly, the light with the same luminance can be extracted with a smaller driving current by means of providing the opening to the second color filter of the second pixel with a short lifespan, compared to a case where the opening is not provided. As a result, with prolonging the lifespan of the second pixel, the lifespan of the electro-optical device can be prolonged.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the present invention will be described with reference to the accompanying drawings. However, in each drawing, the dimensions and scales of portions are different appropriately from those of actual portions. In addition, it is to be understood that the embodiments described below are preferred specific examples of the invention, and a variety of technically preferred limitations may be imposed, but the scope of the invention is not limited to the embodiments, unless a particular statement is given to limit the present invention in the following description.

A. Embodiment

Hereinafter, an electro-optical device 1 according to the present embodiment will be described.

A.1. Overview of Electro-Optical Device

Figure 1:
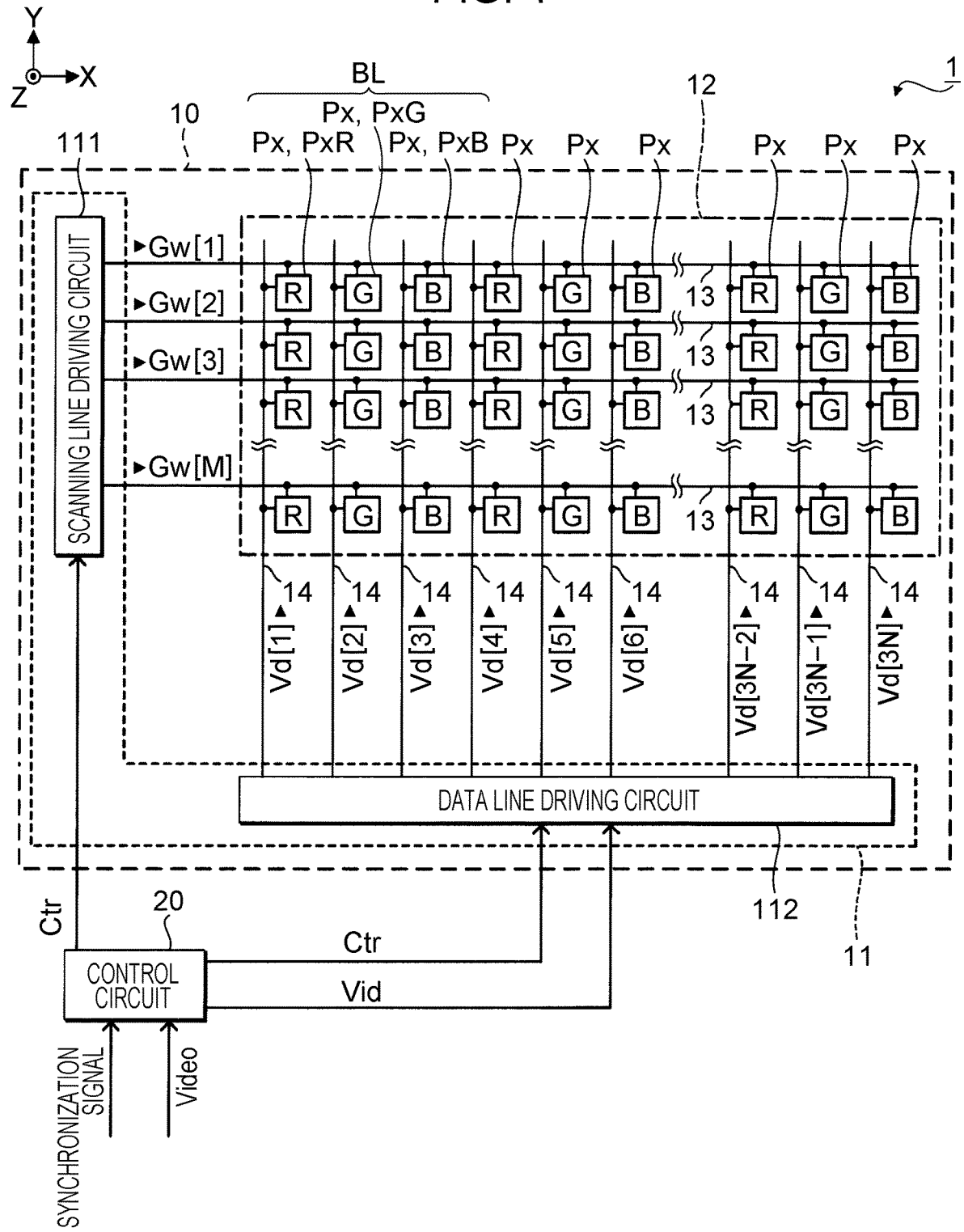
FIG. 1 is a block diagram showing an example of a configuration of an electro-optical device according to an embodiment.

FIG. 1 is a block diagram showing an example of a configuration of the electro-optical device 1 according to the present embodiment.

As illustrated in FIG. 1, the electro-optical device 1 includes a display panel 10 which has a plurality of pixels Px and a control circuit 20 that controls an operation of the display panel 10.

Digital image data Video is supplied to the control circuit 20 from a host device (not shown) in synchronization with a synchronization signal. Herein, the image data Video is digital data which defines a gradation level to be displayed by each pixel Px of the display panel 10. In addition, the synchronization signal is a signal which includes a vertical synchronization signal, a horizontal synchronization signal, a dot clock signal, and the like.

The control circuit 20 generates a control signal Ctr for controlling the operation of the display panel 10 based on a synchronization signal and supplies the generated control signal Ctr to the display panel 10. In addition, the control circuit 20 generates an analog image signal Vid based on the image data Video and supplies the generated image signal Vid to the display panel 10. Herein, the image signal Vid is a signal which defines the luminance of the light-emitting element included in the pixel Px so that each pixel Px displays the gradation designated by the image data Video.

As shown in FIG. 1, the display panel 10 includes M scanning lines 13 extending in the +X direction, 3N data lines 14 extending in the +Y direction, a display portion 12 which has "M×3N" pixels Px disposed corresponding to the intersections of the M scanning lines 13 and the 3N data lines 14, and a driving circuit 11 which drives the display portion 12 (M is a natural number equal to or greater than 1, and N is a natural number equal to or greater than 1).

In the following, in order to distinguish a plurality of the pixels Px from each other, a plurality of the scanning lines 13 from each other, and a plurality of the data lines 14 from each other, a first row, a second row, . . . , an M-th row are given from the +Y direction to the −Y direction in order (hereinafter, +Y direction and −Y direction are generally referred to as "Y-axis direction") and a first column, a second column, . . . a 3N-th column are given from the −X direction to the +X direction in order (hereinafter, +X direction and X direction are generally referred to as "X-axis direction"). In addition, in the following, the +Z direction (upward direction) and the −Z direction (downward direction) intersecting the X-axis direction and the Y-axis direction are generally referred to as the "Z-axis direction".

The plurality of pixels Px provided in the display portion 12 include a pixel PxR which is able to display R, a pixel PxG which is able to display G, and a pixel PxB which is able to display B. Accordingly, in the embodiment, a case where n is "a natural number satisfying 1≤n≤N", out of the first to 3N-th columns, a pixel PxR is disposed in a (3n−2)-th column, a pixel PxG is disposed in a (3n−1)-th column, and a pixel PxB is disposed in a 3n-th column is given as an example.

In addition, in the following, there is a case where a pixel Px in the m-th row and the k-th column is represented as a pixel Px[m][n] on condition that m is "a natural number satisfying 1 m M" and k is "a natural number satisfying 1 k 3N". That is, in the embodiment, it is possible to represent the pixel PxR as a pixel PxR[m][3n−2], the pixel PxG as a pixel PxG[m][3n−1], and the pixel PxB as a pixel PxB[m][3n], for example.

Also, in the embodiment, three pixels PxR, PxG, and PxB adjacent to each other in the X-axis direction may be referred to as a pixel block BL. That is, in the embodiment, there is a case where pixel blocks BL in M rows×N columns are disposed in the display portion 12 in a matrix shape. In the following, there is a case where a pixel block BL including a pixel PxR[m][3n−2], a pixel PxG[m][3n−1], and a pixel PxB[m][3n] is referred to as a pixel block BL[m][n].

As illustrated in FIG. 1, the driving circuit 11 includes a scanning line driving circuit 111 and a data line driving circuit 112.

The scanning line driving circuit 111 scans (select) the first to M-th scanning lines 13 in order. Specifically, the scanning line driving circuit 111 selects the scanning lines 13 in order of each horizontal scanning period as the unit in rows by setting scanning signals Gw[1] to Gw[M] which are respectively output to the first to M-th scanning lines 13 to a predetermined selection potential in order of each horizontal scanning period for one frame period. In other words, the scanning line driving circuit 111 selects the m-th scanning line 13 by setting the scanning signal Gw[M] which is output to the m-th scanning line 13 to a predetermined selection potential in the m-th horizontal scanning period for one frame period. Furthermore, the period of one frame is a period during which the electro-optical device 1 displays one image.

The data line driving circuit 112 generates analog data signals Vd[1] to Vd[3N] which define gradations to be displayed by respective pixels Px based on the image signal Vid and the control signal Ctr supplied from the control circuit 20 and outputs the generated data signals Vd[1] to Vd[3N] to the 3N data lines 14 for each horizontal scanning period. In other words, the data line driving circuit 112 outputs the data signal Vd[k] to the k-th data line 14 for each horizontal scanning period.

Furthermore, in the embodiment, an image signal Vid which is output from the control circuit 20 is an analog signal, but the image signal Vid which is output from the control circuit 20 may be a digital signal. In this case, the data line driving circuit 112 generates analog data signals Vd[1] to Vd[3N] by performing D/A conversion on the image signal Vid.

Figure 2:
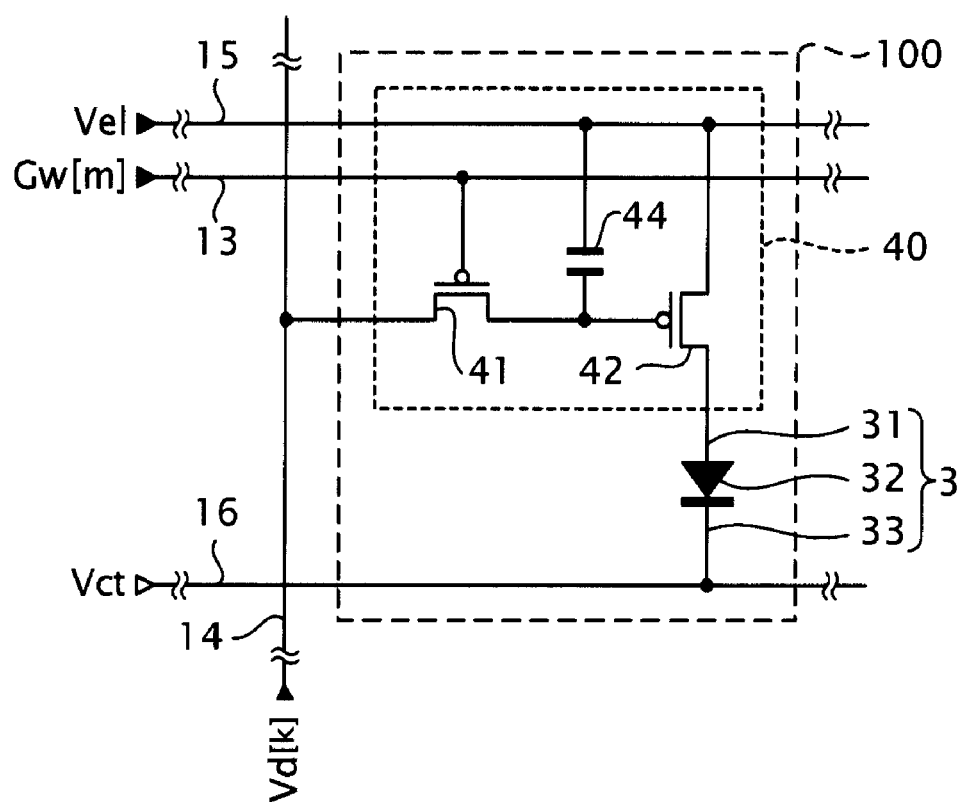
FIG. 2 is an equivalent circuit diagram showing an example of a configuration of a pixel.

FIG. 2 is an equivalent circuit diagram showing an example of a configuration of a pixel circuit 100 provided corresponding to each pixel Px. Furthermore, in the present embodiment, a plurality of the pixel circuits 100 corresponding to the plurality of pixels Px have electrically the same configuration. FIG. 2 describes the pixel circuit 100 which is provided corresponding to the pixel Px[m][k] in the m-th row and the k-th column as an example.

The pixel circuit 100 includes a light-emitting element 3 and a supply circuit 40 which supplies a current to the light-emitting element 3.

The light-emitting element 3 includes a pixel electrode 31, a light-emitting function layer 32, and a counter electrode 33. The pixel electrode 31 functions as an anode which supplies holes to the light-emitting function layer 32. The counter electrode 33 is electrically connected to a feeder line 16 set to a potential Vct which is a power supply potential on a low potential side of the pixel circuit 100, thereby functioning as a cathode which applies electrons to the light-emitting function layer 32. Also, the holes supplied form the pixel electrode 31 are coupled with the electrons supplied from the counter electrode 33 in the light-emitting function layer 32, which allows the light-emitting function layer 32 to emit white light.

Furthermore, although details will be described later, a red color filter 81R is disposed on the light-emitting element 3 of the pixel PxR (hereinafter referred to as light-emitting element 3R) so as to overlap the light-emitting element 3R; a blue color filter 81B is disposed on the light-emitting element 3 of the pixel PxB (hereinafter referred to as light-emitting element 3B) so as to overlap the light-emitting element 3B; and a green color filter 81G is disposed on the light-emitting element 3 of the pixel PxG (hereinafter referred to as light-emitting element 3G) so as to overlap the light-emitting element 3G. For this reason, a full-color display is implemented by means of the pixels PxR, PxG, and PxB.

A supply circuit 40 includes P-channel transistors 41 and 42 and a holding capacitor 44. Furthermore, one or both of the transistors 41 and 42 may be N-channel transistors. In addition, in the embodiment, a case where the transistors 41 and 42 are thin film transistors will be described as an example, and also the transistors 41 and 42 may be field effect transistors such as a metal-oxide-semiconductor field-effect transistor (MOSFET).

In the transistor 41, the gate is electrically connected to the m-th scanning line 13, one of the source and the drain is electrically connected to the k-th data line 14, and the other of the source and the drain is electrically connected to the gate of the transistor 42 and one of two electrodes of the holding capacitor 44.

In the transistor 42, the gate is electrically connected to the other of the source and the drain of the transistor 41 and one of the electrodes of the holding capacitor 44, and one of the source and the drain is electrically connected to the pixel electrode 31, and the other of the source and the drain is electrically connected to the feeder line 15 set to a potential Vel which is a power supply potential on the high potential side of the pixel circuit 100.

In the holding capacitor 44, one of the two electrodes of the holding capacitor 44 is electrically connected to the other of the source and the drain of the transistor 41 and the gate of the transistor 42, and the other of the two electrodes of the holding capacitor 44 is electrically connected to the feeder line 15. The holding capacitor 44 functions as a holding capacitor which holds the potential of the gate of the transistor 42.

When the scanning line driving circuit 111 selects the m-th scanning line 13 by setting the scanning signal Gw[M] to a predetermined selection potential, the transistor 41 provided in the pixel Px[m][k] in the m-th row and the k-th column is turned on. Also, when the transistor 41 is turned on, the data signal Vd[k] is supplied to the gate of the transistor 42 from the k-th data line 14. In this case, the transistor 42 supplies a current corresponding to the potential (to be specific, a potential difference between the gate and the source) of the data signal Vd[k] which is supplied to the gate, to the light-emitting element 3. That is, the transistor 42 is a driving transistor which supplies a current to the light-emitting element 3. The light-emitting element 3 emits light with luminance corresponding to the magnitude of the current which is supplied from the transistor 42, that is, a luminance corresponding to the potential of the data signal Vd[k].

Subsequently, when the m-th scanning line 13 is deselected by the scanning line driving circuit 111 so that the transistor 41 is turned off, the potential at the gate of the transistor 42 is held by the holding capacitor 44. For this reason, even after the transistor 41 is turned off, the light-emitting element 3 can emit light with luminance corresponding to the data signal Vd[k].

Figure 4:
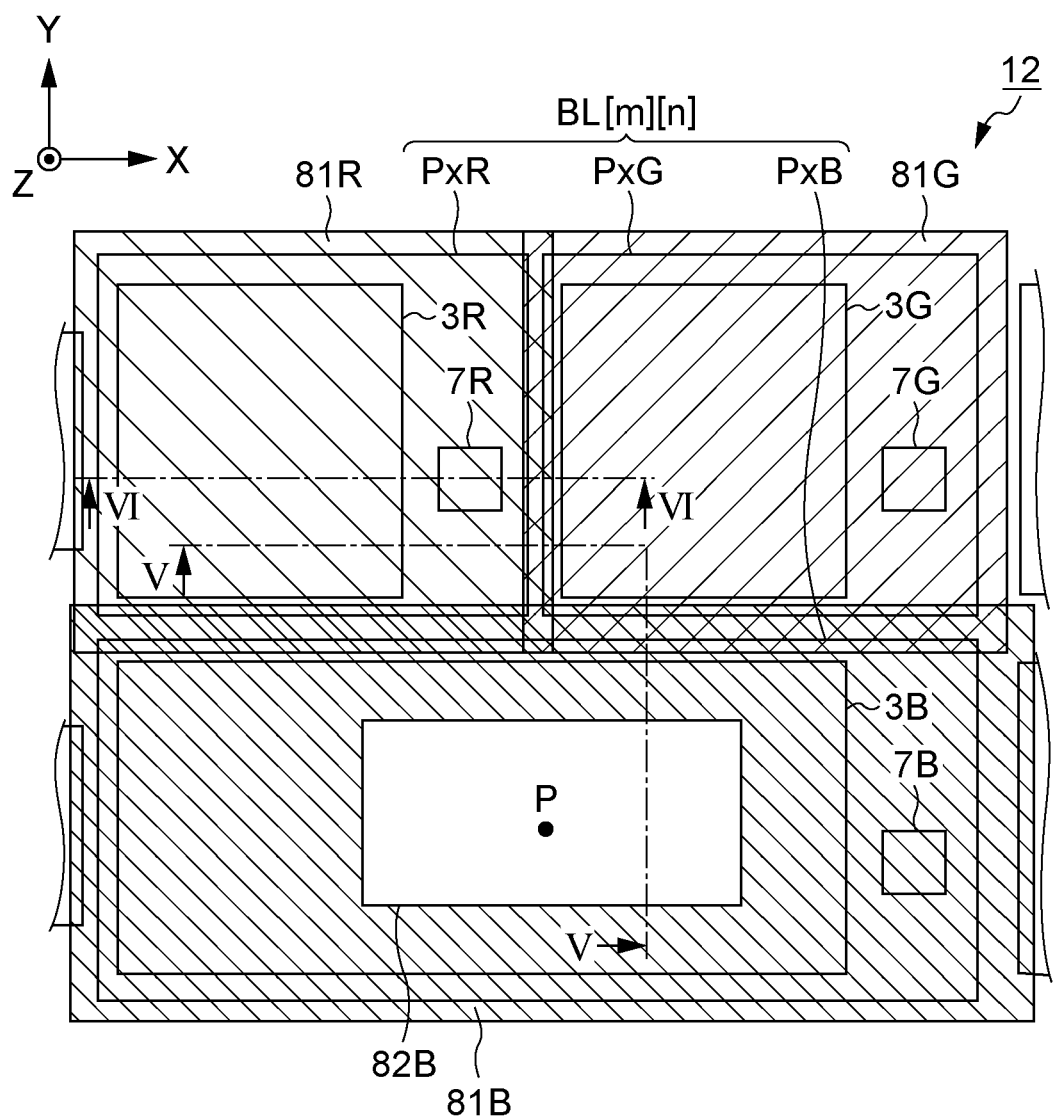
FIG. 4 is a plan view showing an example of the configuration of the display portion (part 2).

Furthermore, although not shown in FIG. 2, a components which connects electrically the pixel electrode 31 of the light-emitting element 3 to the supply circuit 40 is referred to as a contact 7 (see FIG. 4). The contact 7 is included in the pixel P. More specifically, the contact 7 connects electrically the pixel electrode 31 of the light-emitting element 3 to the supply circuit 40. Hereinafter, there is a case where the contact 7 provided in the pixel PxR is referred to as a contact 7R, the contact 7 provided in the pixel PxG is referred to as a contact 7G, and the contact 7 provided in the pixel PxB is referred to as a contact 7B.

A.2. Configuration of Display Portion

Hereinafter, with reference to FIGS. 3 to 6, an example of the configuration of the display portion 12 according to the present embodiment will be described.

Figure 3:
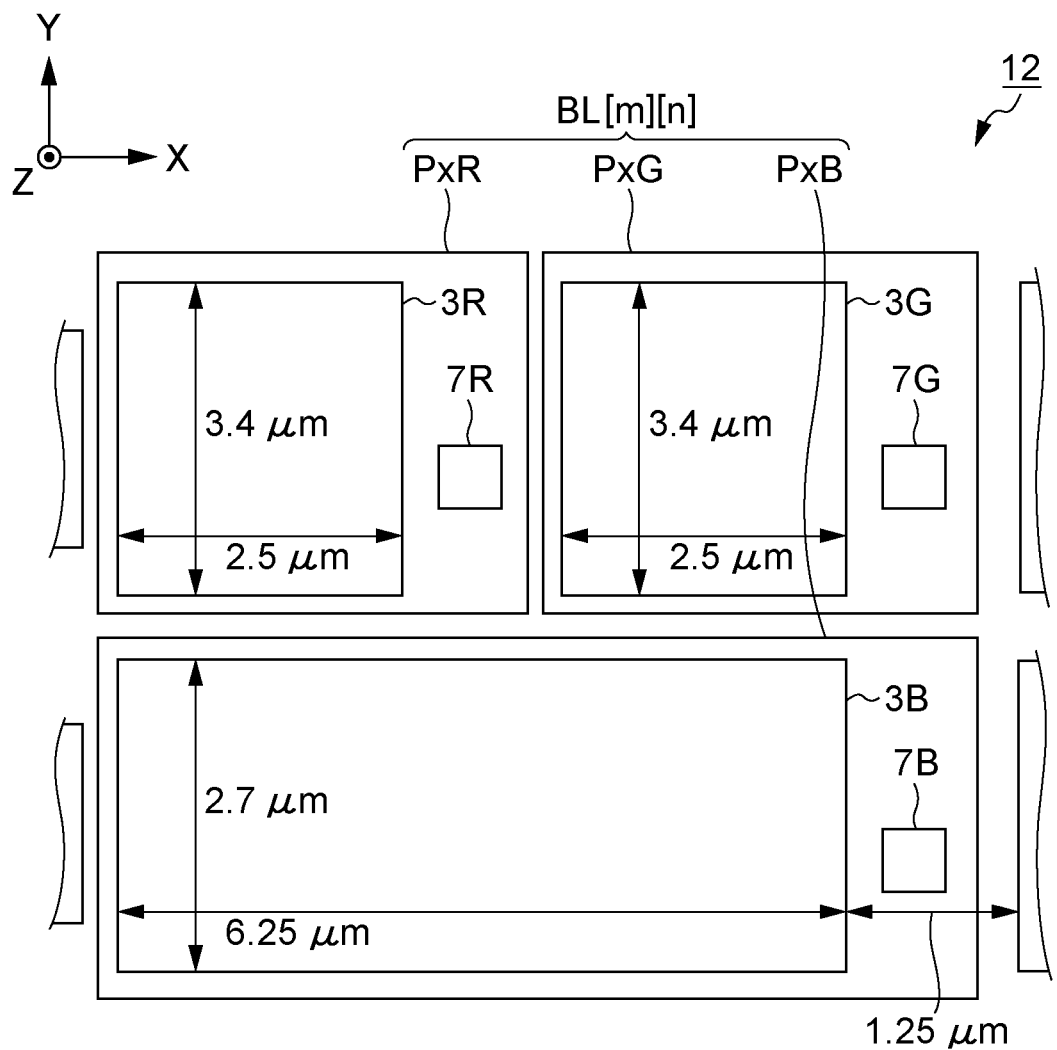
FIG. 3 is a plan view showing an example of a configuration of a display portion (part 1).

FIG. 3 is a plan view showing an example of a schematic configuration of the display portion 12 in such a case where a part of the display portion 12 according to the embodiment is viewed from the +Z direction in which the electro-optical device 1 emits light, in the plan view. However, the plan view shown in FIG. 3 is shown except the color filter 81 to make the drawing easily viewable.

Specifically, FIG. 3 shows the pixel block BL[m][n] in the display portion 12. The pixel block BL[m][n] includes the pixel PxR, the pixel PxG, and the pixel PxB.

In the embodiment, as shown in FIG. 3, it is assumed that in each pixel block BL, the light-emitting element 3R provided in the pixel PxR is positioned in the +Y direction of the light-emitting element 3B provided in the pixel PxB, and the light-emitting element 3G provided in the pixel PxG is positioned in the +Y direction of the light-emitting element 3B provided in the pixel PxB and in the +X direction of the light-emitting element 3R provided in the pixel PxR. Also, in the embodiment, it is assumed that light is emitted by means of the light-emitting elements 3R, 3G, and 3B of each pixel block BL in the +Z direction. Additionally, in the embodiment, in the plan view from the +Z direction, it is assumed that the area of the light-emitting element 3B is larger than that of the light-emitting element 3R and the area of the light-emitting element 3B is larger than that of the light-emitting element 3G. In the embodiment, in the plan view from the +Z direction, the light-emitting elements 3R, 3G, and 3B have a rectangular shape.

In addition, in FIG. 3, the contact 7R is a component which connects electrically the pixel electrode 31 in the pixel PxR to the supply circuit 40; the contact 7G is a component which connects electrically the pixel electrode 31 in the pixel PxG to the supply circuit 40; and the contact 7B is a component which connects electrically the pixel electrode 31 in the pixel PxB to the supply circuit 40.

In the present embodiment, as shown in FIG. 3, the contact 7 of each pixel Px which belongs to the pixel block BL is located in the +X direction of the light-emitting element 3 of each pixel Px.

FIG. 4 is a plan view showing an example of a schematic configuration of the display portion 12 in such a case where a part of the display portion 12 according to the present embodiment is viewed from the +Z direction in the plan view. The plan view shown in FIG. 4 is described, adding the color filters 81 to the plan view shown in FIG. 3.

The color filter 81R is formed on the +Z side of the light-emitting element 3R so as to overlap the pixel PxR in the plan view from the +Z direction. Similarly, the color filter 81G is formed on the +Z side of the light-emitting element 3G so as to overlap the pixel PxG in the plan view from the +Z direction. The color filter 81B is formed on the +Z side of the light-emitting element 3B so as to overlap the pixel PxB, and has an opening 82B in the plan view from the +Z direction.

Herein, since the light-emitting element 3B has the shortest lifespan out of the light-emitting elements 3R, 3G and 3B, the lifespan of the electro-optical device 1 is determined by the lifespan of the light-emitting element 3B. The larger the driving current is, the shorter the lifespan of the light-emitting element 3 is. Accordingly, blue light with the same luminance can be extracted in a smaller driving current by means of providing the opening 82B to the color filter 81B, compared to a case where the opening 82B is not provided. As a result, with providing the opening 82B in the pixel PxB, the lifespan of the electro-optical device can be prolonged.

Figure 5:
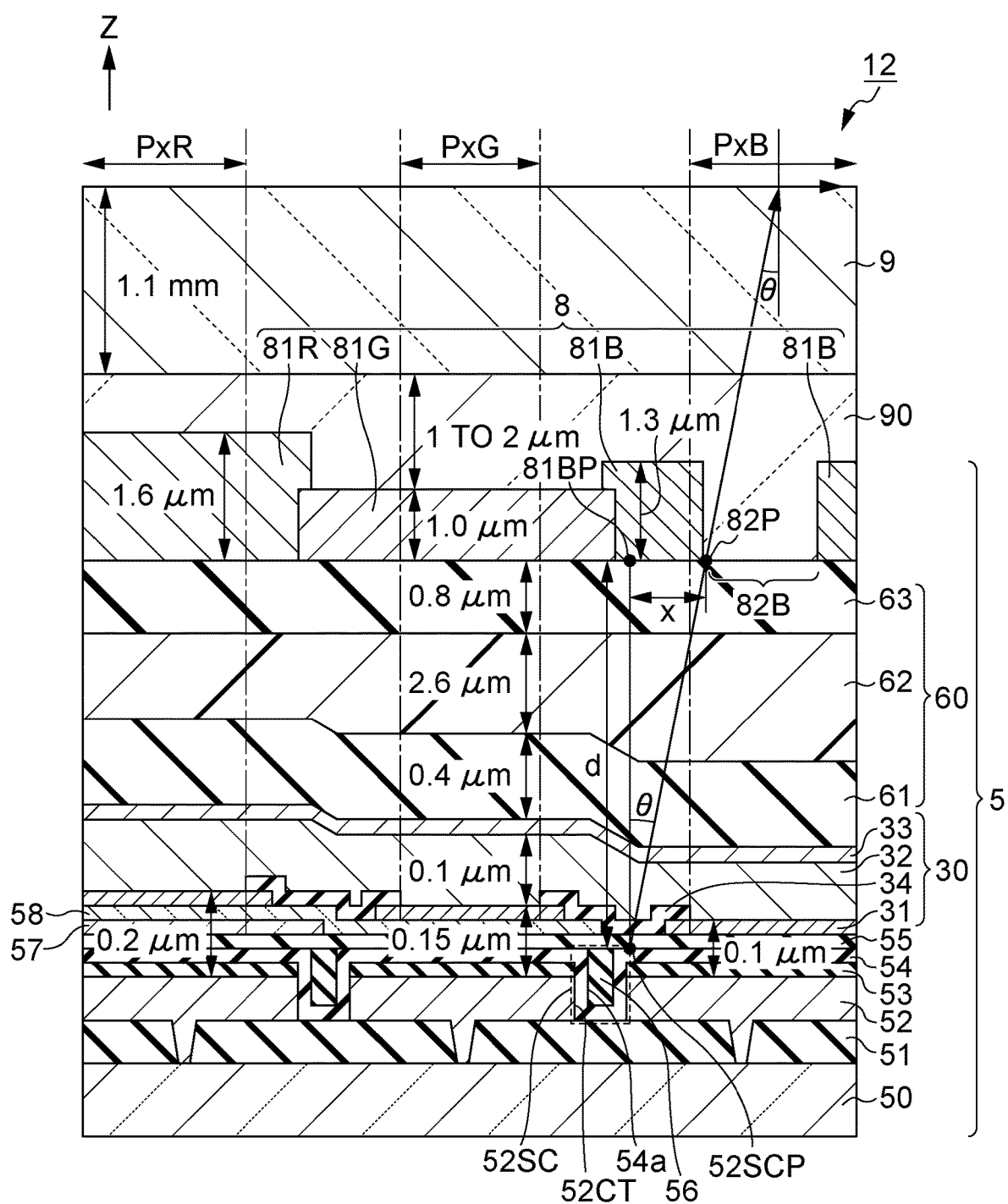
FIG. 5 is a partial cross-section view showing an example of the configuration of the display portion (part 1).

FIG. 5 is an example of a partial-cross sectional view of the display portion 12 taken along line V-V in FIG. 4, including the cross section of the pixel PxR, the cross section of the pixel PxG, and the cross section of the pixel PxB.

As shown in FIG. 5, the display portion 12 includes an element substrate 5, a protective substrate 9, and an adhesive layer 90 which is interposed between the element substrate 5 and the protective substrate 9. Furthermore, in the present embodiment, there is a case where the electro-optical device 1 has the top emission structure of which light is emitted from the protective substrate 9 (+Z side). In addition, in the following description, the refractive index of the material which is used for the display portion 12 at a light wavelength of 610 nm and the thickness of the material will be described.

The adhesive layer 90 is a transparent resin layer in order to cause the element substrate 5 and the protective substrate 9 to adhere. For example, the adhesive layer 90 is formed of a transparent resin material such as an epoxy resin with a refractive index of 1.54. The thickness of the adhesive layer 90 is set to 2 to 3 μm.

The protective substrate 9 is a transparent substrate which is disposed on the +Z side of the adhesive layer 90. The protective substrate 9 protects members, such as the color filters 81, which are disposed on the −Z side of the protective substrate 9. The protective substrate 9 is formed of, for example, a quartz substrate with the refractive index of 1.46. The thickness of the protective substrate 9 is set to 1.1 mm.

The element substrate 5 includes a substrate 50, an interlayer insulating layer 51 laminated on the substrate 50, a reflective layer 52, a reflection enhancing layer 53, a first insulating layer 54, a second insulating layer 55, a light-emitting layer 30, a sealing layer 60, and a color filter layer 8. The light-emitting elements 3 (3R, 3G, 3B) described above are included in the light-emitting layer 30, and details will be described later. The light-emitting element 3 emits light in the +Z direction and the −Z direction. In addition, the color filter layer 8 includes the color filter 81R, the color filter 81G, and the color filter 81B described above.

The substrate 50 is formed by a wide range of wirings such as the scanning line 13 and the data line 14 and circuits such as the driving circuit 11 and the pixel circuit 100. A substrate on which a wide range of wirings and circuits can be mounted is preferably used for the substrate 50. A silicon substrate, a quartz substrate, a glass substrate, or the like can be adopted as the substrate 50, for example. An interlayer insulating layer 51 is laminated on the +Z side of the substrate 50.

For example, an insulating material such as silicon oxide ($SiO_2$) is used for the interlayer insulating layer 51. The reflective layer 52 is laminated on the +Z side of the interlayer insulating layer 51.

The reflective layer 52 is a component to reflect the light emitted from the light-emitting element 3 in the light-emitting layer 30 toward the +Z direction. The reflective layer 52 is included in the pixel Px. For example, an AlCu alloy film (aluminum (Al) and copper (Cu)) with a film thickness of 0.15 μm is formed on a titanium (Ti) film as the reflective layer 52.

The reflection enhancing layer 53 is served as the layer for improving a reflection characteristic in the reflective layer 52, for example, and is formed of a transmissive insulating material. The reflection enhancing layer 53 is disposed so as to cover the upper side of the reflective layer 52. For example, a silicon oxide film with a refractive index of 1.46 is formed as the reflection enhancing layer 53. The thickness of the reflection enhancing layer 53 is 0.035 µm.

The first insulating layer 54 is formed on the upper side of the reflection enhancing layer 53 along a gap 52CT. Accordingly, the first insulating layer 54 is provided with a recess 54a corresponding to the gap 52CT. The buried insulating film 56 is formed so as to fill the recess 54a. The second insulating layer 55 is formed on the upper side of the first insulating layer 54. For example, silicon nitride (SiN) films with a refractive index of 1.8 are formed as the first insulating layer 54 and the second insulating layer 55. The total thickness of the first insulating layer 54 and the second insulating layer 55 is 0.055 µm in the pixel PxR, 0.05 µm in the pixel PxG, and 0.045 µm in the pixel PxB.

A first distance adjustment layer 57 and a second distance adjustment layer 58 are transparent insulating layers for adjusting the optical distance between the light-emitting element 3 in the light-emitting layer 30 and the reflective layer 52 for each of pixels PxR, PxG, PxB. In the embodiment, silicon oxide films with a refractive index of 1.46 are formed as the first distance adjustment layer 57 and the second distance adjustment layer 58. Furthermore, the thickness of the formed silicon oxide films is set such that the total thicknesses of the first distance adjustment layer 57 and the second distance adjustment layer 58 in the pixel PxR is approximately 0.1 µm and the thickness of the second distance adjustment layer 58 in the pixel PxG is 0.05 µm. In the case of the pixel PxG, the lamination between the first distance adjustment layer 57 and the second distance adjustment layer 58 is not performed.

The light-emitting layer 30 includes the pixel electrode 31, a pixel separation layer 34, the light-emitting function layer 32 which is laminated so as to cover the pixel electrode 31 and the pixel separation layer 34, and a counter electrode 33 laminated on the light-emitting function layer 32.

The pixel electrode 31 is a transparent layer which is formed in an island shape for each pixel Px and has conductivity. The pixel electrode 31 is laminated on the second insulating layer 55, the first distance adjustment layer 57, and the second distance adjustment layer 58. The pixel electrode 31 is formed of a conductive transparent material, for example, Indium Tin Oxide(ITO) with a refractive index of 1.7 to 1.8. The thickness of the pixel electrode 31 is 0.02 µm.

The counter electrode 33 is a conductive component which is disposed so as to cross the plurality of pixels Px and has transparency and light reflectivity. The counter electrode 33 is formed of, for example, an alloy of Mg and Ag and the like. The thickness of the counter electrode 33 is 0.02 µm.

The pixel separation layer 34 is an insulating component disposed so as to cover the peripheral portion of each pixel electrode 31. The pixel separation layer 34 is laminated on the second distance adjustment layer 58, the second insulating layer 55, and the pixel electrode 31. The pixel separation layer 34 is formed of an insulating material, for example, silicon oxide and the like.

The light-emitting function layer 32 includes a hole injection layer, a hole transport layer, an organic light-emitting layer, and an electron transport layer, and is disposed so as to cross the plurality of pixels Px. The refractive index of the light-emitting function layer 32 is set to 1.7 to 1.8, and the thickness of the light-emitting function layer 32 is set to approximately 0.1 µm.

As described above, the hole is supplied from a portion of the pixel electrode 31 which is not covered with the pixel separation layer 34 so that the light-emitting function layer 32 emits white light. That is, in the plan view, in the light-emitting layer 30, the portion of the pixel electrode 31 which is not covered with the pixel separation layer 34 corresponds to the light-emitting element 3. In other words, the pixel separation layer 34 functions as a "division portion" by which two light-emitting elements 3 adjacent to each other are divided.

Additionally, in the embodiment, in the plan view, a portion provided with the light-emitting element 3 is expected to a pixel Px. In other words, in the plan view, the pixel separation layers 34 are disposed such that a plurality of pixels Px of the display portion 12 are divided by the pixel separation layers 34. Furthermore, the white light emitted from the light-emitting element 3 includes red light, green light, and blue light.

In the embodiment, the thicknesses of the first distance adjustment layer 57 and the second distance adjustment layer 58 are adjusted so that an optical resonance structure is formed by means of the reflective layer 52 and the counter electrode 33. Also, the light emitted from the light-emitting function layer 32 is repeatedly reflected between the reflective layer 52 and the counter electrode 33 so that the intensity of the light with a wavelength corresponding to the optical distance between the reflective layer 52 and the counter electrode 33 is improved. Then, the intensified light is emitted toward the +Z side through the counter electrode 33 to the protective substrate 9.

In the embodiment, as an example, the thicknesses of the first distance adjustment layer 57 and the second distance adjustment layer 58 are set for each pixel Px such that the intensity of light with a wavelength of 610 nm is improved in the pixel PxR, the intensity of light with a wavelength of 540 nm is improved in the pixel PxG, and the intensity of light with a wavelength of 470 nm is improved in the pixel PxB. For this reason, in the embodiment, red light in which the luminance of light with a wavelength of 610 nm is maximized is emitted in the pixel PxR, green light in which the luminance of light with a wavelength of 540 nm is maximized is emitted in the pixel PxG, and blue light in which the luminance of light with a wavelength of 470 nm is maximized is emitted in the pixel PxB.

A sealing layer 60 includes a lower sealing layer 61 laminated on the counter electrode 33, a planarizing layer 62 laminated on the lower sealing layer 61, and an upper sealing layer 63 laminated on the planarizing layer 62.

The lower sealing layer 61 and the upper sealing layer 63 are transparent layers which are disposed so as to cross the plurality of pixels Px and have an insulation property. The lower sealing layer 61 and the upper sealing layer 63 are components for preventing moisture, oxygen, and the like from entering the light-emitting layer 30. For example, silicon oxide nitride (SiON) films with a refractive index of 1.75 to 1.8 are formed as the lower sealing layer 61 and the upper sealing layer 63. The thickness of the lower sealing layer 61 is 0.4 µm. In addition, the thickness of the upper sealing layer 63 is 0.8 µm.

The planarizing layer 62 is a transparent layer which is disposed so as to cross the plurality of pixels Px and a component for providing a flat upper surface (a surface on the +Z side). For example, the planarizing layer 62 is formed of an inorganic material such as an epoxy resin with a refractive index of 1.54. The thickness of the planarizing layer 62 is approximately 2.6 µm in the pixel PxR, 2.6 µm in the pixel PxG, and 2.65 µm in the pixel PxB.

The color filter layer 8 includes the color filters 81R, 81G, and 81B.

As shown in FIG. 5, the color filters 81R, 81G, and 81B are formed on the upper sealing layer 63.

The color filters 81R, 81G, 81B are formed in a manner that a photosensitive resin which contains a pigment which causes the light in different colors, for example, red, green and blue, to be transmitted is applied and then patterning is performed thereto. The refractive indexes of the color filters 81R, 81G, 81B are approximately 1.65. In addition, the thickness of the color filter 81R is 1.6 μm, the thickness of the color filter 81G is 1.0 μm, and the thickness of the color filter 81B is 1.3 μm.

Figure 6:
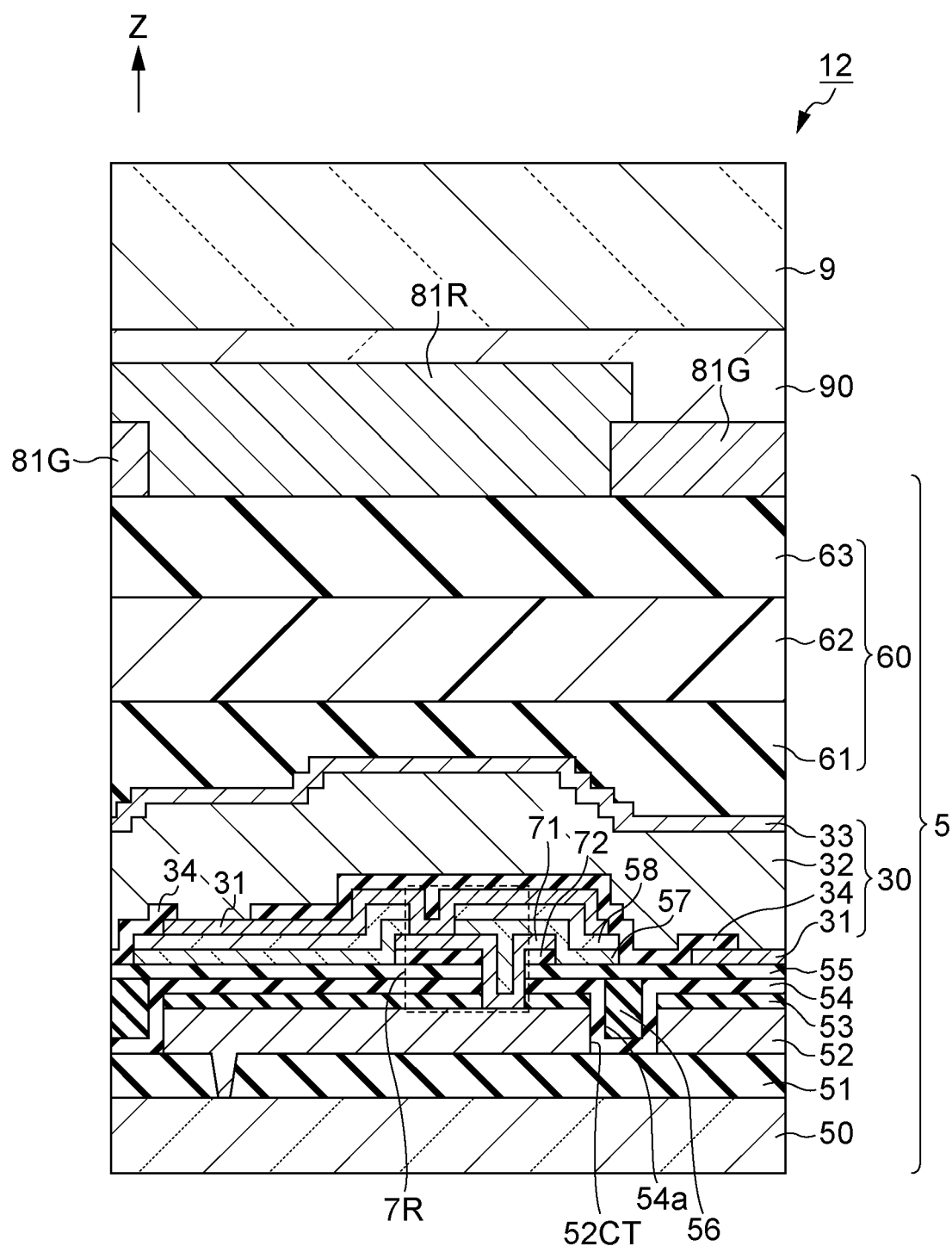
FIG. 6 is a partial cross-section view showing an example of the configuration of the display portion (part 2).

FIG. 6 is an example of a partial-cross sectional view taken along line VI-VI in FIG. 4, including the cross section of the contact 7R in the display portion 12. In FIG. 6, the members regarding the contact 7R will be described, but the description of the members described in FIG. 5 will be omitted.

The display portion 12 includes a contact electrode 71 and a protective layer 72. The contact electrode 71 is laminated on the reflective layer 52 and the protective layer 72. The contact electrode 71 is formed of a conductive material such as tungsten (W), titanium (Ti), titanium nitride (TiN) and the like. The protective layer 72 is laminated on the second insulating layer 55. The protective layer 72 is formed of an insulating material such as silicon oxide and the like.

A.3. Effect of Embodiments

When the light emitted from the light-emitting element 3 is scattered due to the incident in the scattering structure, the light becomes the internal scattered light. The scattering structure is a portion where a step difference of each member laminated on the substrate 50 or non-uniformity of each member is generated. For example, as shown in FIG. 5, the first distance adjustment layer 57 and the second distance adjustment layer 58 are laminated in the −Z direction of the light-emitting layer 30 so that unevenness is generated on the light-emitting layer 30. Accordingly, in the case of the light-emitting layer 30, the scattering structure is positioned between the pixel PxR and the pixel PxG and between the pixel PxG and the pixel PxB. In the embodiment, in the plan view from the +Z direction, the color filter 81B overlaps the pixel PxB by the structure of the color filter 81B and the internal scattered light from the scattering structure is absorbed into the color filter 81B, which allows the quality of display images to be improved. Furthermore, since a part of the light emitted from the light-emitting element 3B is not absorbed into the color filter 81B due to the opening 82B, the luminance of the pixel PxB can be increased.

Additionally, as shown in FIG. 4, in the plan view from the +Z direction, the opening 82B preferably overlaps the center P of the pixel PxB. The scattering structure is present largely at the end of the pixel P, whereas the scattering structure is small in the vicinity of center of the pixel P. For this reason, the amount of emitted internal scattered light in the vicinity of the center P is smaller than that of the end of the pixel PxB. Accordingly, in the plan view from the +Z direction, correct light which is not internal scattered light is hardly absorbed into the color filter 81B by means of overlapping of the opening 82B and the center P, which allows the luminance of the pixel PxB to be increased.

Additionally, as shown in FIG. 4, in the plan view from the +Z direction, an area of the color filter 81B other than the opening 82B preferably overlaps a part or the entirety of the scattering structure in which light emitted from at least one of the light-emitting elements 3xR, 3xG, and 3xB is scattered. Herein, the scattering structure is, for example, the contact 7B. As shown in FIG. 4, in the plan view, the internal scattered light is emitted easily from the scattering structure, and an area of the color filter 81B other than the opening 82B overlaps the contact 7B. Accordingly, the internal scattered light emitted from the contact 7B is easily absorbed into the color filter 81B. Therefore, the deterioration in the quality of display images can be suppressed.

In addition, the scattering structure is preferably positioned in at least one of a portion between the reflective layer 52 of the pixel PxR or the reflective layer 52 of the pixel PxG, and the reflective layer 52 of the pixel PxB, and the contact 7B. FIG. 5 shows an area 52SC between the reflective layer 52 of the pixel PxG and the reflective layer 52 of the pixel PxB as an example of the scattering structure. Accordingly, the internal scattered light is generated easily and the internal scattered light generated from at least one of a portion between the reflective layers 52 of the two pixels, and the contact 7B is easily absorbed into the color filter 81B. Therefore, the deterioration in the quality of display images can be suppressed.

In addition, an incident angle of light which passes through the end of the opening 82B to reach the interface between the protective substrate 9 and the air with respect to the interface, out of the internal scattered light, is preferably equal to or greater than the critical angle, in the cross section including the end of the opening 82B and the scattering structure along the Z direction. When the angle θ is equal to or greater than the critical angle θc, the internal scattered light is totally reflected at the interface of the protective substrate 9, thereby not being emitted to the outside of the electro-optical device. The internal scattered light which is totally reflected is absorbed into the color filter 81. Accordingly, the deterioration in the quality of display images can be suppressed.

Herein, since the light which passes through the end of the opening 82B to reach the interface between the protective substrate 9 and the air passes through a plurality of layers with the different refractive indexes, the light is refracted whenever passing through a layer and cannot travel in a straight line shape. In FIG. 5, in order to simplify the explanation, it is assumed that only the refraction at the interface between the protective substrate 9 and the air is considered and refraction on the −Z side from the protective substrate 9 is not considered. In this case, the light which passes through the end of the opening 82B to reach the interface between the protective substrate 9 and the air can travel in a straight line shape. The angle between the straight line and the Z axis is preferably equal to or greater than the critical angle of the protective substrate 9. With reference to FIG. 5, the angle θ formed between a straight line connecting a point 82P at the end of the opening 82B to a point 52SCP in the area 52SC and the Z axis may be equal to or greater than the critical angle θc of the protective substrate 9. Accordingly, θ satisfies the following expression (1).

$$\theta = \tan^{-1}(x/d) \qquad (1)$$

However, x represents the distance from a point 81BP at which the line parallel to the Z-axis passing through the point 52SCP overlaps the color filter 81B to the point 82P. In addition, d represents the distance from the point 52SCP to the point 81BP. The critical angle θc of the protective substrate 9 can be obtained by the refractive index of the protective substrate 9 and the refractive index of the air.

Furthermore, the lifespan of the pixel PxB corresponding to the color filter 81 provided with the opening 82B is preferably shorter than the lifespan of other pixels Px. Herein, since the light-emitting element 3B has the shortest lifespan among the light-emitting elements 3R, 3G and 3B, the lifespan of the electro-optical device 1 is determined by the lifespan of the light-emitting element 3B. The larger the driving current is, the shorter the lifespan of the light-emitting element 3 is. Accordingly, as illustrated in FIG. 4, blue light with the same luminance can be extracted with a smaller driving current by means of providing the opening 82B to the color filter 81B, compared to a case where the opening 82B is not provided. As a result, with providing the opening 82B in the pixel PxB, the lifespan of the electro-optical device 1 can be prolonged.

Furthermore, in the embodiment, for example, the pixel PxR and the pixel PxG correspond to a "first pixel", and the pixel PxB corresponds to a "second pixel". In addition, at least one of the color filter 81R and the color filter 81G corresponds to a "first color filter". Also, the color filter 81B corresponds to a "second color filter". The scattering structure corresponds to a "structure in which light emitted from at least one light-emitting element of the first pixel and the second pixel is scattered". The reflective layer 52 is an example of a "reflective electrode". The protective substrate 9 is an example of a "transparent member". The Z-axis is an example of the "normal direction of the substrate 50". The plan view from the +Z direction is an example of "a plan view of the substrate 50 from the normal direction".

B. Modification Example

Each of embodiments described above may be variously modified. The detailed modification example will be described below. Any two or more aspects selected from the following examples may be appropriately combined with consistency within the scope. Furthermore, in the following modification examples, components having the same actions and functions as those of the embodiments are given the signs referred to in the above description, and detailed descriptions thereof are omitted appropriately.

B.1. First Modification Example

Figure 7:
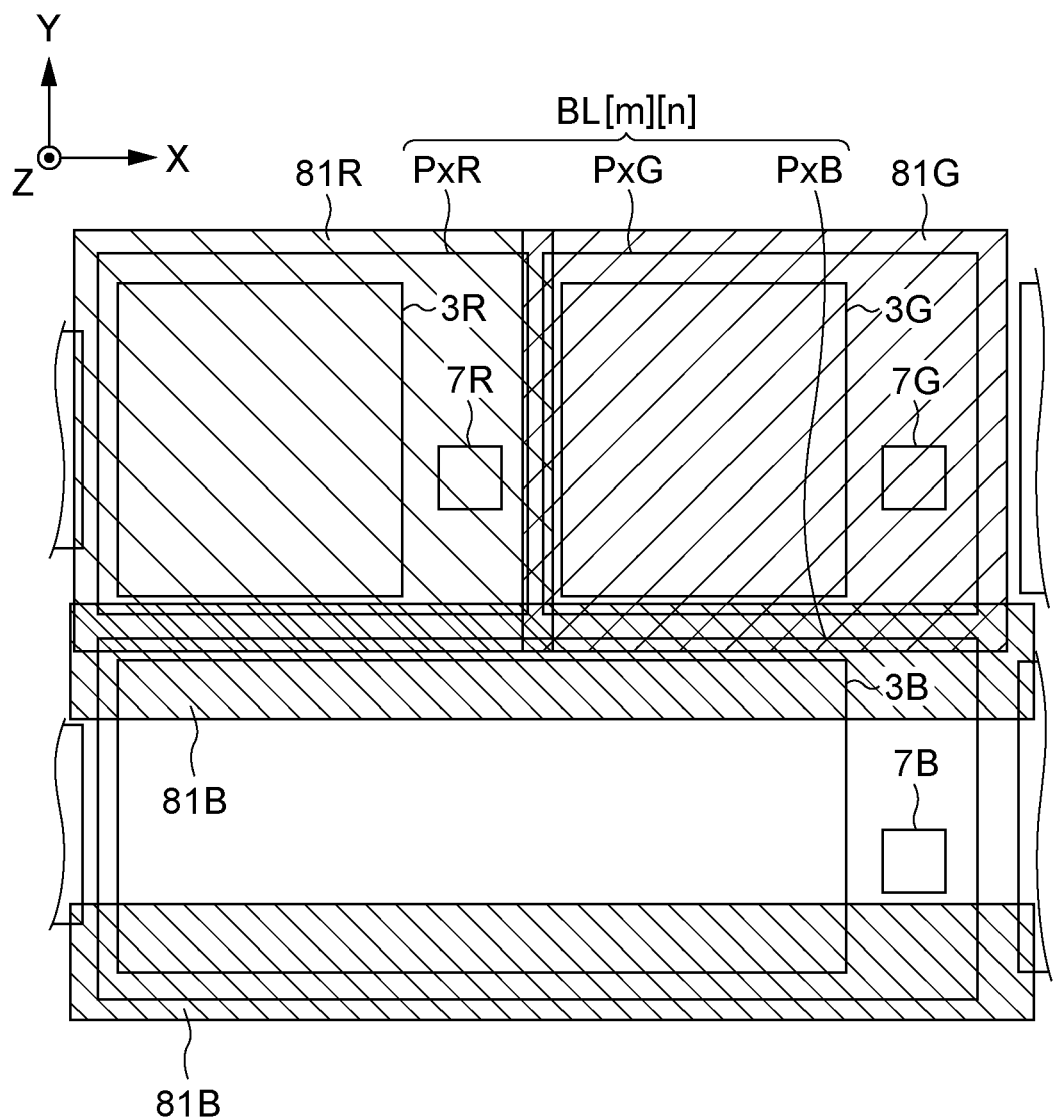
FIG. 7 is a plan view showing an example of a configuration of a display portion according to a first modification example.

FIG. 7 is a plan view showing an example of a schematic configuration of the display portion 12 in such a case where a part of the display portion 12 according to the first modification example is viewed from the +Z direction in the plan view. In the present embodiment, the color filter 81B overlaps all sides of the pixel PxB in the plan view from the +Z direction. On the other hand in the plan view from the +Z direction, the color filter 81B according to the first modification example overlaps the side in the −Y direction and the side in the +Y direction when viewed from the center of the pixel PxB, whereas there is a part which does not overlap the side in the −X direction and the side in the +X direction. Light-extraction efficiency of blue light can be improved by means of the color filter 81B according to the first modification example, compared to the color filter 81B according to the embodiment.

B.2. Second Modification Example

Figure 8:
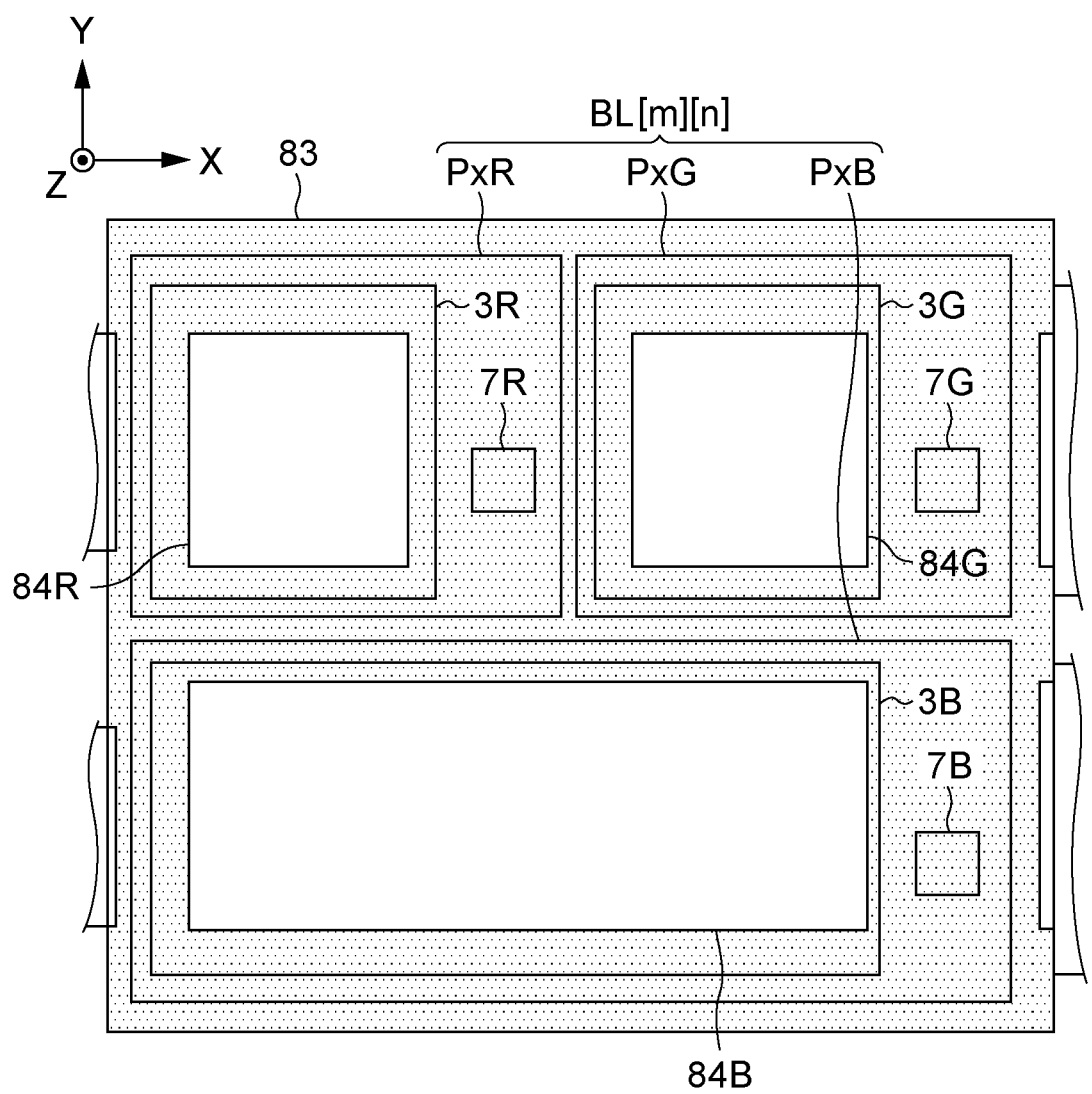
FIG. 8 is a plan view showing an example of a configuration of a display portion according to a second modification example.

FIG. 8 is a plan view showing an example of a schematic configuration of the display portion 12 in such a case where a part of the display portion 12 according to the second modification example is viewed from the +Z direction in the plan view. The second modification example has a configuration in which a transparent barrier material 83 is provided on the display portion 12 according to the first modification example. Herein, the plan view shown in FIG. 8 is shown except the color filter 81 so as to make the drawings easily viewable. The barrier material 83 includes openings 84R, 84G, and 84B. In the plan view from the +Z direction, the opening 84R overlaps the center of the pixel PxR. In addition, the opening 84G overlaps the center of the pixel PxG. The opening 84B overlaps the center of the pixel PxB. As shown in FIGS. 7 and 8, the display portion 12 may have or may not have the barrier material 83.

B.3. Third Modification Example

Figure 9:
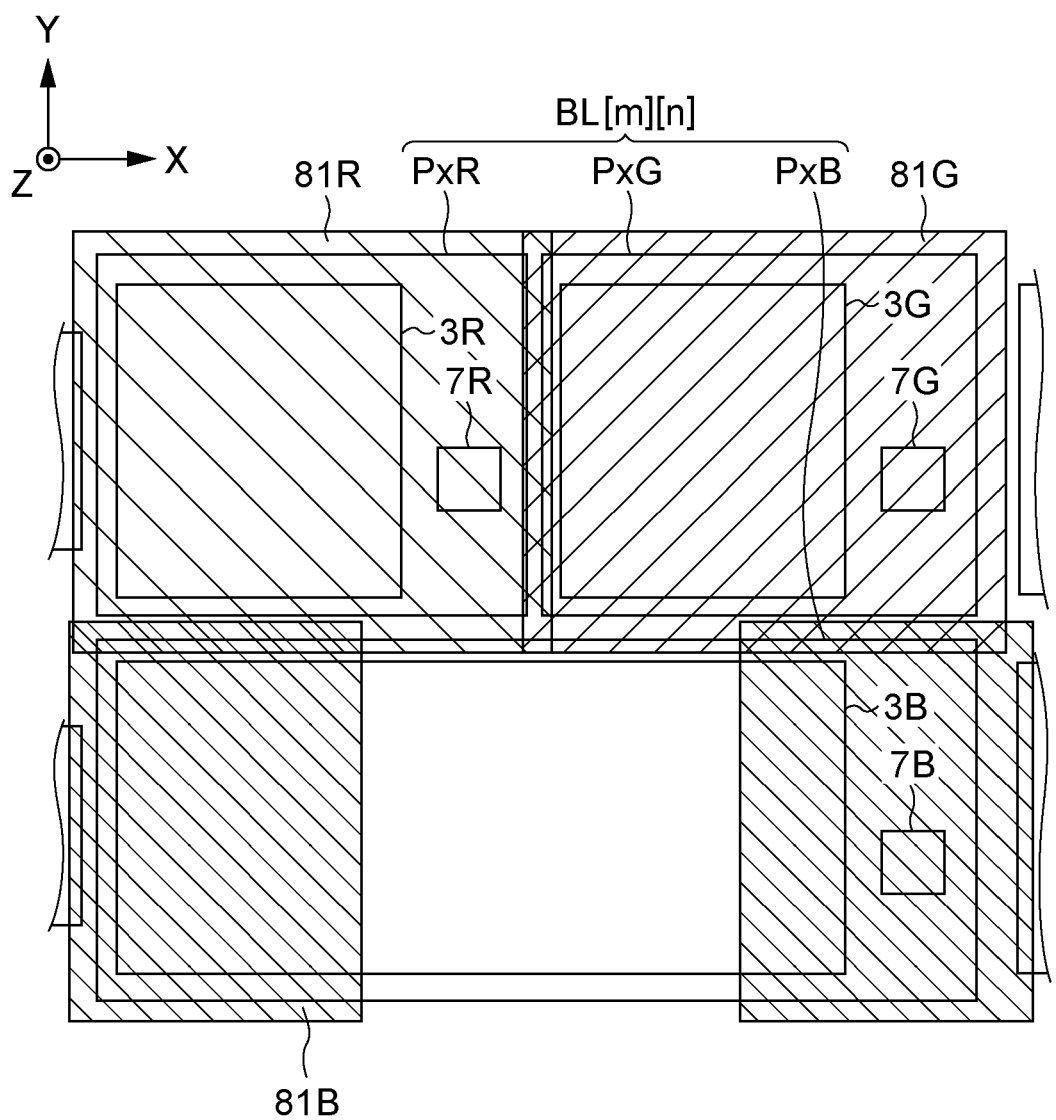
FIG. 9 is a plan view showing an example of a configuration of a display portion according to a third modification example.

FIG. 9 is a plan view showing an example of a schematic configuration of the display portion 12 in such a case where a part of the display portion 12 according to the third modification example is viewed from the +Z direction in the plan view. In the plan view from the +Z direction, the color filter 81B according to the third modification example overlaps the side in the −X direction and the side in the +X direction viewed from the center of the pixel PxB, whereas there is a part which does not overlap the side in the −Y direction and the side in the +Y direction. Light-extraction efficiency of blue light can be improved by means of the color filter 81B according to the third modification example, compared to the color filter 81B according to the embodiment.

B.4. Forth Modification Example

In the above-described embodiment, the pixel PxB corresponding to the color filter 81 provided with the opening 82B is a blue pixel, but the invention is not limited thereto, and any color pixels may be used. In short, an electro-optical device in which a color filter with an opening and a color filter with no opening are provided at the same time may be used. Furthermore, an area of the color filter provided with the opening other than the opening overlaps the scattering structure in the plan view so that the internal scattered light can be prevented from leaking to the outside while the luminance of the pixel of the color filter which is provided with the opening is improved.

C. Application Example

The electro-optical device 1 according to the embodiments and the modification examples described above can be applied to a wide range of electronic apparatuses. Hereinafter, an electronic apparatus according to the present invention will be described.

Figure 10:
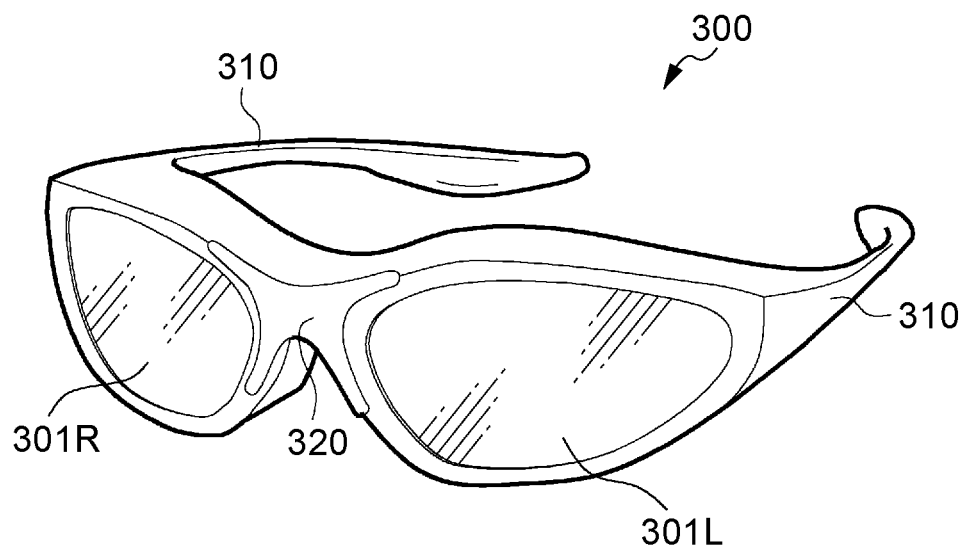
FIG. 10 is a perspective view of a head mounted display according to an aspect of the invention.

FIG. 10 is a perspective view showing an external appearance of a head mounted display 300 as an electronic apparatus which employs the electro-optical device 1 according to the present invention. As shown in FIG. 10, the head mounted display 300 includes a temple 310, a bridge 320, a projection optical system 301L, and a projection optical system 301R. Also, in FIG. 10, the electro-optical device 1 (not shown) for the left eye is provided in the depth of the projection optical system 301L, and the electro-optical device 1 (not shown) for the right eye is provided in the depth of the projection optical system 301R.

Figure 11:
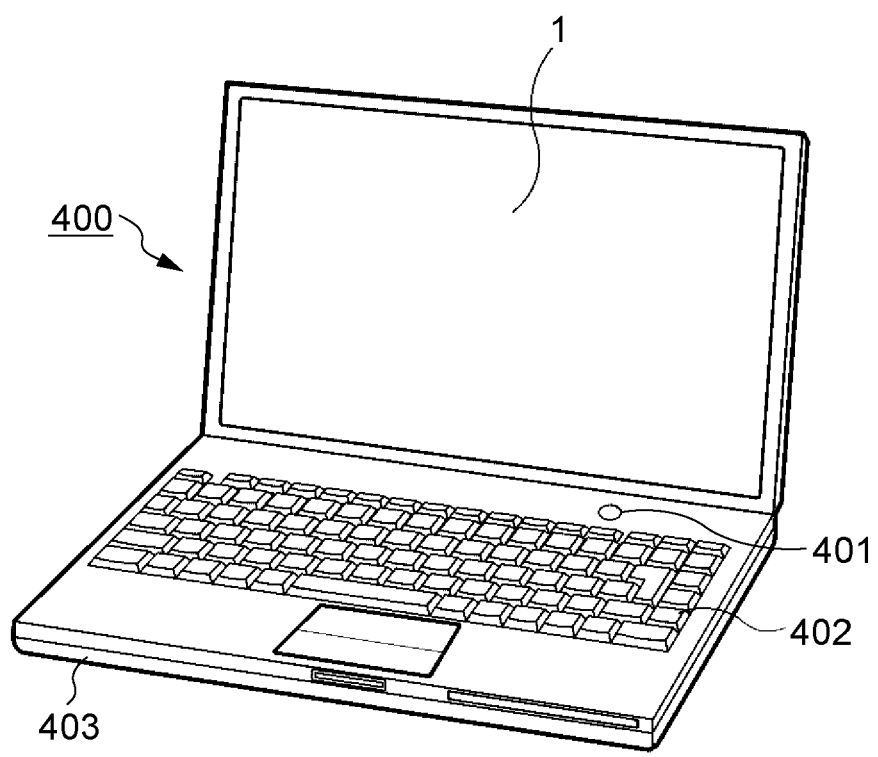
FIG. 11 is a perspective view of a personal computer according to an aspect of the invention.

FIG. 11 is a perspective view of a portable personal computer 400 which employs the electro-optical device 1. The personal computer 400 includes the electro-optical device 1 which displays a wide range of images, and a main body portion 403 provided with a power supply switch 401 and a keyboard 402.

Furthermore, examples of the electronic apparatus to which the electro-optical device 1 according to the present invention is applied include a mobile phone, a smartphone, a personal digital assistant (PDA), a digital still camera, a television, a video camera, a car navigation device, an in-vehicle display device (instrument panel), an electronic notebook, an electronic paper, an electronic calculator, a word processor, a workstation, a video phone, a POS terminal and the like in addition to the apparatuses illustrated in FIGS. 10 and 11. Furthermore, the electro-optical device 1 according to the present invention can be applied as a display portion provided in an electronic apparatus such as a printer, a scanner, a copying machine, a video player, and the like.

The entire disclosure of Japanese Patent Application No. 2017-128228, filed Jun. 30, 2017 is expressly incorporated by reference herein

What is claimed is:

1. An electro-optical device comprising:
a first pixel that emits light of a first wavelength region;
a second pixel that emits light of a second wavelength region which is shorter than light of the first wavelength region;
a first color filter area, the first color filter area including a first color filter that overlaps the first pixel in a plan view; and
a second color filter area, the second color filter area including a second color filter that overlaps with the second pixel in plan view, the second color filter area having an opening that does not include the second color filter, wherein
the first color filter area has no opening; and
the opening overlaps with the second pixel.

2. The electro-optical device according to claim 1, wherein the opening overlaps a center of the second pixel in the plan view.

3. An electronic apparatus comprising the electro-optical device according to claim 2.

4. The electro-optical device according to claim 1, wherein each of the first pixel and the second pixel includes a light-emitting element, and an area of the second color filter other than the opening overlaps a part or an entirety of a structure in which light emitted from at least one light-emitting element of the first pixel and the second pixel is scattered in the plan view.

5. The electro-optical device according to claim 4,
wherein each of the first pixel and the second pixel includes the light-emitting element, a supply circuit which supplies a current to the light-emitting element, a contact which electrically connects the supply circuit to the light-emitting element, and a reflective electrode, and
the structure is at least one of a portion between the reflective electrode of the first pixel and the reflective electrode of the second pixel, and the contact of the second pixel.

6. An electronic apparatus comprising the electro-optical device according to claim 5.

7. The electro-optical device according to claim 4, further comprising:
a transparent member that protects the first color filter and the second color filter,
wherein an incident angle of light which passes through an end of the opening to reach an interface between the transparent member and air with respect to the interface, out of light scattered from the structure, is equal to or greater than a critical angle in a cross section including the end of the opening and the structure along the normal line.

8. An electronic apparatus comprising the electro-optical device according to claim 7.

9. The electro-optical device according to claim 4,
wherein a lifespan of the light-emitting element of the second pixel is shorter than a lifespan of the light-emitting element of the first pixel.

10. An electronic apparatus comprising the electro-optical device according to claim 9.

11. An electronic apparatus comprising the electro-optical device according to claim 4.

12. The electro-optical device according to claim 1,
wherein each of the first pixel and the second pixel includes a light-emitting element, a supply circuit which supplies a current to the light-emitting element, a contact which electrically connects the supply circuit to the light-emitting element, and a reflective electrode, and
an area of the second color filter overlaps a portion between the reflective electrode of the first pixel and the reflective electrode of the second pixel.

13. An electronic apparatus comprising the electro-optical device according to claim 12.

14. The electro-optical device according to claim 1,
wherein each of the first pixel and the second pixel includes a light-emitting element, a supply circuit which supplies a current to the light-emitting element, a contact which electrically connects the supply circuit to the light-emitting element, and a reflective electrode, and
an area of the second color filter overlaps the contact of the second pixel.

15. An electronic apparatus comprising the electro-optical device according to claim 14.

16. An electronic apparatus comprising the electro-optical device according to claim 1.

17. The electro-optical device according to claim 1, wherein
the opening is surrounded by the second color filter, and
the opening is disposed in same layer as the second color filter.

18. The electro-optical device according to claim 17, wherein
an area of the second color filter other than the opening overlaps a structure in which light emitted from at least the first pixel and the second pixel is scattered in plan view.

19. The electro-optical device according to claim 1, further comprising:
a third pixel that emits light of a third wavelength region which is longer than light of the first wavelength region; and
a third color filter that overlaps with the third pixel, wherein
the third color filter does not have an opening.

20. An electro-optical device comprising: a first pixel that emits light of a first wavelength region, a second pixel that emits light of a second wavelength region which is shorter than light of the first wavelength region; a third pixel that emits light of a third wavelength region which is shorter than light of the second wavelength region; a first color filter area, the first color filter area including a first color filter disposed corresponding to the first pixel; a second color filter area, the second color filter area including a second color filter disposed corresponding to the second pixel; and a third color filter area, the third color filter area including a third color filter disposed corresponding to the third pixel, the third color filter area having an opening that does not include the third color filter, wherein the first color filter area and the second color filter area have no opening, and the opening overlaps with the third pixel.

* * * * *